(12) United States Patent
Crompvoets et al.

(10) Patent No.: US 9,991,238 B2
(45) Date of Patent: Jun. 5, 2018

(54) LED LIGHT SOURCE FOR AUTOMOTIVE APPLICATION

(71) Applicant: KONINKLIJKE PHILIPS N.V., Eindhoven (NL)

(72) Inventors: Floris Maria Hermansz Crompvoets, Bunde (NL); Norbertus Antonius Maria Sweegers, Lierop (NL); Hugo Johan Cornelissen, Escharen (NL); Marc Andre de Samber, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days. days.

(21) Appl. No.: 15/325,693

(22) PCT Filed: Jul. 17, 2015

(86) PCT No.: PCT/EP2015/066452
§ 371 (c)(1),
(2) Date: Jan. 11, 2017

(87) PCT Pub. No.: WO2016/009061
PCT Pub. Date: Jan. 21, 2016

(65) Prior Publication Data
US 2017/0200708 A1    Jul. 13, 2017

(30) Foreign Application Priority Data
Jul. 18, 2014 (EP) ..................................... 14177598

(51) Int. Cl.
*H01L 31/00* (2006.01)
*H01L 25/075* (2006.01)
(Continued)

(52) U.S. Cl.
CPC ........ *H01L 25/0756* (2013.01); *G02B 6/0006* (2013.01); *G02B 6/0008* (2013.01); *H01L 33/60* (2013.01)

(58) Field of Classification Search
CPC .................................................. H01L 25/0756
See application file for complete search history.

(56) References Cited

U.S. PATENT DOCUMENTS 3,877,052 A * 4/1975 Dixon .................. G02B 6/4204
257/95
2006/0291203 A1* 12/2006 Anandan .............. G02B 6/0043
362/231

(Continued)

FOREIGN PATENT DOCUMENTS

DE    102007011123 A1    9/2008
DE    102007041896 A1    3/2009

(Continued)

OTHER PUBLICATIONS

EPO as ISA, "International Search Report and Written Opinion" dated Sep. 21, 2015 from International Application No. PCT/EP2015/066452, filed Jul. 17, 2015, 11 pages.

(Continued)

*Primary Examiner* — Sitaramarao S Yechuri (57) ABSTRACT

Proposed is a light source comprising first and second LED light sources. Each of the first and second LED light sources have: a semiconductor diode structure adapted to generate light; and a light output section above the semiconductor diode structure adapted to output light from the semiconductor diode structure in a light output direction, the area of the light output section being less than the area of the semiconductor diode structure. The second LED light source is arranged above and at least partially overlapping the first (Continued)

LED light source with non-aligned light output sections with respect to the light output direction.

23 Claims, 6 Drawing Sheets

(51) Int. Cl.
*H01L 33/60* (2010.01)
*F21V 8/00* (2006.01)

(56) References Cited

U.S. PATENT DOCUMENTS

| | | |
|---|---|---|
| 2010/0084668 A1 | 4/2010 | Choi et al. |
| 2011/0198649 A1 | 8/2011 | Yamada et al. |
| 2011/0204325 A1* | 8/2011 | Kim ............... H01L 33/382 257/13 |
| 2012/0305959 A1 | 12/2012 | Yu et al. |
| 2013/0329440 A1* | 12/2013 | Tsutsumi ............ H01L 33/50 362/465 |
| 2014/0367708 A1* | 12/2014 | Sorg ............... H01L 25/0753 257/88 |
| 2016/0020353 A1* | 1/2016 | Chu ............... H01L 31/02327 257/21 |

FOREIGN PATENT DOCUMENTS

| | | |
|---|---|---|
| DE | 102009015307 A1 | 9/2010 |
| DE | 102011087887 A1 | 6/2013 |
| JP | 2009094294 A | 4/2009 |

OTHER PUBLICATIONS

Extended European Search Report dated Jan. 26, 2015, European Application No. 14177598.1, 8 pages.

* cited by examiner

LED LIGHT SOURCE FOR AUTOMOTIVE APPLICATION

CROSS-REFERENCE TO RELATED APPLICATIONS

The present application is a § 371 application of International Application No. PCT/EP2015/066452 filed on Jul. 17, 2015 and entitled "LED LIGHT SOURCE FOR AUTOMOTIVE APPLICATION," which claims the benefit of European Patent Application No. 14177598.1 filed on Jul. 18, 2014. International Application No. PCT/EP2015/066452 and European Patent Application No. 14177598.1 are incorporated herein.

FIELD OF THE INVENTION

This invention relates to a light source, and more particularly to a light source comprising a plurality of semiconductor light sources.

BACKGROUND OF THE INVENTION

Semiconductor light sources, such as light emitting diodes (LEDs), high power LEDs, organic LEDs (OLEDs) and laser diodes are known to be energy efficient and small light sources that have a small/low etendue (i.e. the product of emitting area with solid angle in which the light is emitted). This implies that these semiconductor light sources emit light from a relatively small area into a limited angular range.

Such semiconductor light sources may therefore be beneficial for applications where a bright light source is needed. Typical example applications include projection systems, automotive lighting, camera flashlights, and spot lights. For these examples, improved miniaturization is often desirable. However, merely reducing the size of a semiconductor light source reduces the generated light flux.

Figure 1A:
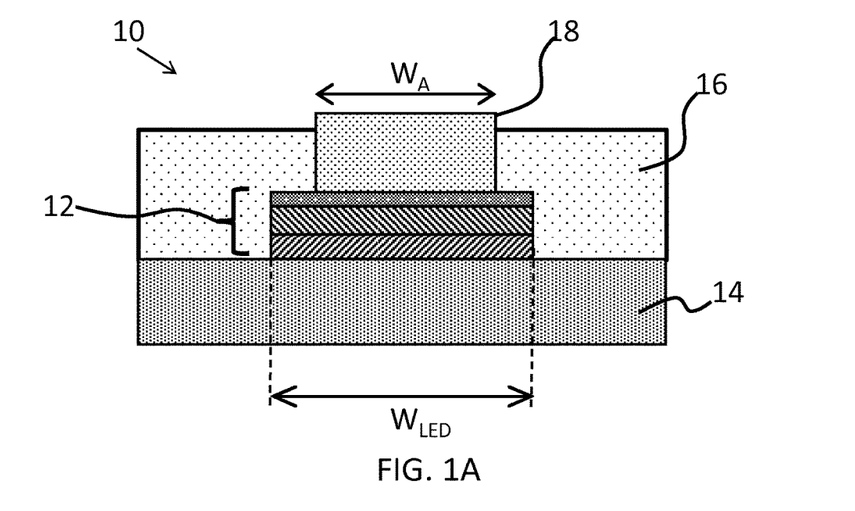
FIG. 1A is a cross-sectional view of a known LED light source.
Figure 1B:
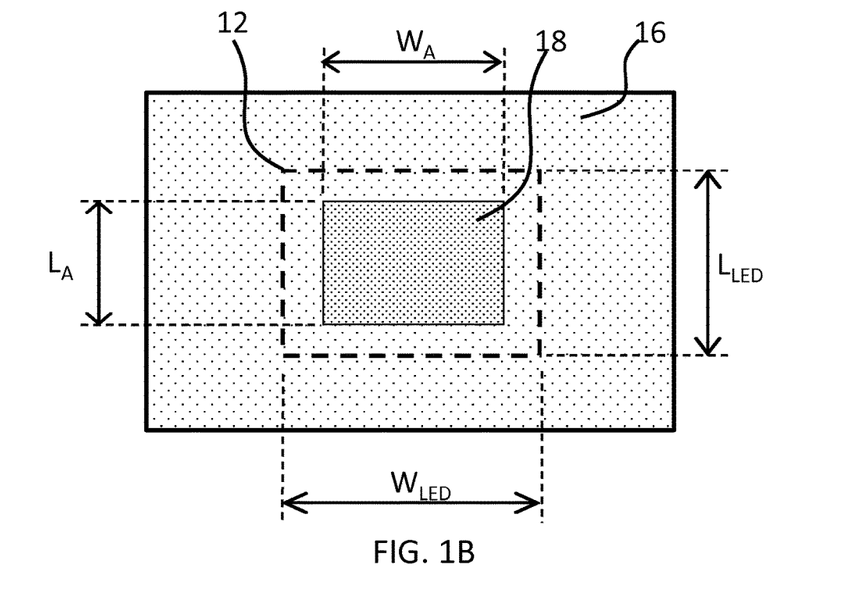
FIG. 1B is a plan view of the known LED light source of FIG. 1A.

It is known to obtain increased luminance from a semiconductor light source by means of a mix box with a small aperture (i.e. light output section) from which the light can escape. FIGS. 1A and 1B illustrate a known LED-based light source 10 employing this concept, wherein light generated by an LED 12 (on a die substrate 14) is recycled/reflected in a mix box 16 having high reflectivity until it escapes via a small aperture 18. By the aperture 18 being "small" it is simply meant as being smaller than the LED 12 such that the aperture area $A_A$ (i.e. width $W_A \times L_A$) is less than the LED area $A_{LED}$ (i.e. width $W_{LED} \times L_{LED}$) of the LED 12.

It is known to form the aperture 18 from a luminous ceramic material or other phosphorescent material.

SUMMARY OF THE INVENTION

The invention is defined by the claims.

According to an aspect of the invention there is provided a light source comprising first and second LED light sources, each of the first and second LED light sources having: a semiconductor diode structure adapted to generate light; and a light output section above the semiconductor diode structure adapted to output light from the semiconductor diode structure in a light output direction, the area of the light output section being less than the area of the semiconductor diode structure, and wherein the second LED light source is arranged above and at least partially overlapping the first LED light source with non-aligned light output sections with respect to the light output direction.

Embodiments may achieve space savings by vertically stacking LED light sources and arranging the LED light sources to overlap each other whilst not vertically aligning their light output sections. Thus, there is proposed a concept for employing high luminance LED light sources that have light output sections which are of lesser area than the light generating portions of the light sources. By arranging such a light source to overlap an area of another such light source (e.g. a non-light-outputting section), the overlapped area (which does not output light) can be used to provide a saving/reduction in the size of the footprint of the two light sources.

In other words, embodiments may provide a high-luminance light source comprising vertically-stacked and partially overlapping sub-sources. The position(s) and/or shape of the light output sections can be changed or designed to enable tiling of the sub-sources such that edges of the light output sections can be closely aligned (when viewed from above).

Multiple LED light sources may therefore be strategically arranged in the vertical axis so that they overlap without aligning the light output sections along the light output direction (e.g. a vertical axis). For example, a plurality of LED light sources may be vertically offset from each other and arranged such that, when viewed from directly above (i.e. plan view), the LED light sources at least partially overlap and each light output section is (laterally) adjacent at least one other light output section. By arranging the LED light sources to overlap, space savings (e.g. a reduction in foot print size) may be achieved.

The LED light sources of the present disclosure may be any type of LED, such as a Flip Chip type (Thin Film Flip Chip), Patterned Sapphire Substrate, top connected/top emission, top-bottom connected. Also, the light source could be used as naked die, or packaged.

A light output section (or light emission area) of an LED light source refers to an area towards or through which light from the LED is output (or emitted). A cavity or cavities of a LED light source may thus extend towards the light output section. The light output section may for example be an area of the growth substrate, such as sapphire. Also, the light output direction is generalised to be in a single direction (e.g. vertical in the Figures) along which light is output from the light output section. However, it will be understood that not all light output from a light output section may be output exactly along the output direction. Thus, the light output direction should be understood to refer to the general direction along which light is output from a light output section, extending away from the surface of the light output section for example.

The light output sections of LED light sources may be arranged to be non-overlapping. Furthermore, the light output sections may be arranged such that there is substantially zero separation between adjacent edges of the light output sections. In practice, however, it may be difficult to perfectly align adjacent edges to have zero lateral separation or overlap. Thus, in embodiments, light output sections may slightly overlap or may be laterally separated by a negligible or small amount. For example, there may be a lateral separation or overlap between the adjacent edges of the light output sections of two LED light sources, and this lateral separation or overlap may be less than 10% of the lateral width of the light output sections. In embodiments, it may be preferable to reduce such separation or overlap to a minimum value (e.g. less than 5% of the lateral width of the light output sections, and even more preferably less than 1% of the lateral width of the light output sections).

In an embodiment, a LED light source may further comprise a light reflecting structure at least partially enclosing side surfaces of the semiconductor diode structure and adapted to reflect light from the semiconductor diode structure towards the light output section. Furthermore, the light output section of the LED light source having a light reflecting structure may comprise an aperture formed in the light reflecting structure. Also, the semiconductor diode structure of the light source having an aperture formed in the light reflecting structure may comprise an optical enhancement material.

In an embodiment, the light output section of at least one of the first and second LED light sources may comprise an optical enhancement material.

Optical enhancement material may be a 'color conversion fill', such as a luminous ceramic material or phosphorescent material. This may further help to maintain the etendue of the lateral emission area.

In an embodiment, the first LED light source may further comprise a plurality of upwardly projecting optical fibres positioned on top of the light output section of the first LED light source. Stacking the LED light sources in the vertical direction results in the first LED light source being further away from a light exit plane (situated on top of or above the second LED light source) than the second LED light source. Employing an array of closely packed optical fibres positioned on the light output section of the first LED light source and extending upwardly towards the light exit plane, for example, light from the first LED light source can be transmitted along the optical fibres and output from the optical fibres closer to the light exit plane.

Further, if an embodiment comprises a plurality of cavities, some or all of the cavities may comprise (e.g. be filled with) different materials. As an example, certain cavities may be filled with a first type of phosphor (e.g. converting blue to white) and other cavities may be filled with another type of phosphor (e.g. converting blue to red).

Embodiments may be employed in the field of automotive lighting and other fields/applications where high-luminance lighting is desirable.

Thus, according to an aspect of the invention, there may be provided an automotive light comprising a light source according to an embodiment.

According to another aspect of the invention, there may be provided a projector light comprising a light source according to an embodiment.

According to yet another aspect of the invention, there is provided a method of manufacturing a light source comprising first and second LED light sources, each of the first and second LED light sources having: a semiconductor diode structure adapted to generate light; and a light output section above the semiconductor diode structure adapted to output light from the semiconductor diode structure in a light output direction, the area of the light output section being less than the area of the semiconductor diode structure, the method comprising the step of: arranging the second LED light source above and at least partially overlapping the first LED light source with non-aligned light output sections with respect to the light output direction.

The step of arranging may comprise arranging the light output sections of the first and second LED light sources to be non-overlapping.

The step of arranging may comprise arranging the first and second LED light sources such that there is a lateral separation between the adjacent edges of the light output sections of the first and second LED light sources, the lateral separation being less than 10% of the lateral width of the light output sections.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a light source comprising a plurality of LED light sources and a method for manufacturing the same. Embodiments may be of particular relevance to applications that require light of high or increased luminance from a relatively small and/or efficient light source.

Embodiments employ the concept of vertically stacking LED light sources (having light output sections of reduced size compared to the LED size) so that they overlap each other whilst not (vertically) aligning or entirely overlapping their light output sections. In this way, space savings may be achieved by overlapping the portions of the LED light sources that do not output light.

The term vertical, as used herein, means substantially orthogonal to the surface of a substrate. The term lateral, as used herein, means substantially parallel to the surface of a substrate. Also, terms describing positioning or locations (such as above, below, top, bottom, etc.) are to be construed in conjunction with the orientation of the structures illustrated in the diagrams.

The diagrams are purely schematic and it should therefore be understood that the dimensions of features are not drawn to scale. Accordingly, the illustrated thickness of any of the layers should not be taken as limiting. For example, a first layer drawn as being thicker than a second layer may, in practice, be thinner than the second layer.

Figure 2:
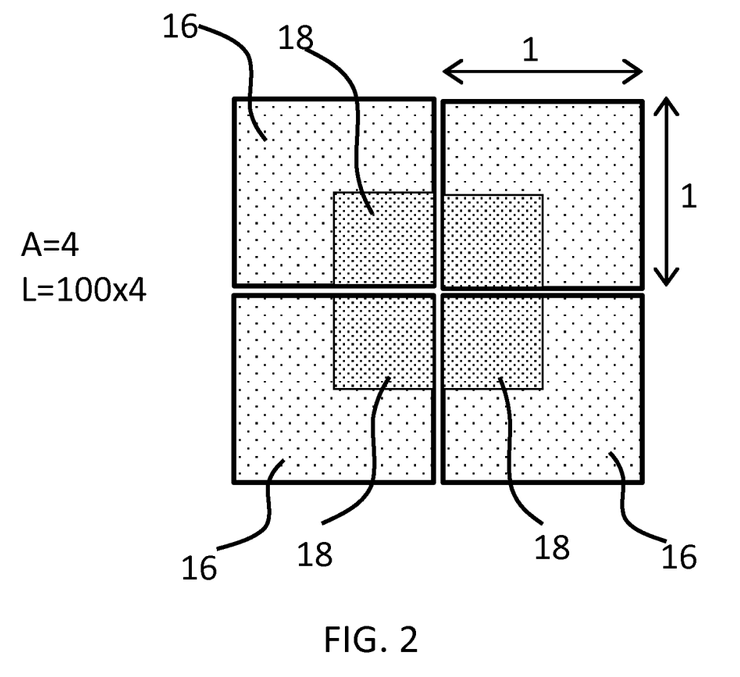
FIG. 2 is a plan view of four LED light sources arranged in a tiled, non-overlapping arrangement.

FIG. 2 is a plan view of four LED-based light sources (each being similar to that shown in FIGS. 1A and 1B) arranged in a tiled, non-overlapping arrangement. The LED-based light source are similar to that shown in FIGS. 1A and 1B in that they each comprise an LED (not visible) within a mix box 16 having an aperture 18 (or light output section 18) of smaller area than the LED 12. As has already been detailed in the background section above, such LED-based light sources exhibit increased luminance and so may be referred to as "high-luminance LED light sources".

As shown in FIG. 2, each LED light source differs from that shown in FIGS. 1A and 1B in that the light output section is positioned at a corner of the LED light source (rather than the centre of LED light source as in FIGS. 1A and 1B), such that a corner and two edges of the light output section corresponding with a corner and two edges of the LED-based light source. Here, the light output sections of the respective LED light sources are positioned in different corners such that, when arranged in the tiled, non-overlapping arrangement, the light output sections 18 are adjacent each other.

With the width and length of each LED light source being one (1) unit, it will be easily understood that the total area of the depicted arrangement is four (4) units ((1+1)×(1+1)).

Also, with each LED light source emitting 100 lumen from its respective light output section, it will be easily understood that the total light emitted from the arrangement is 400 lumen (4×100 lumen).

Figure 3A:
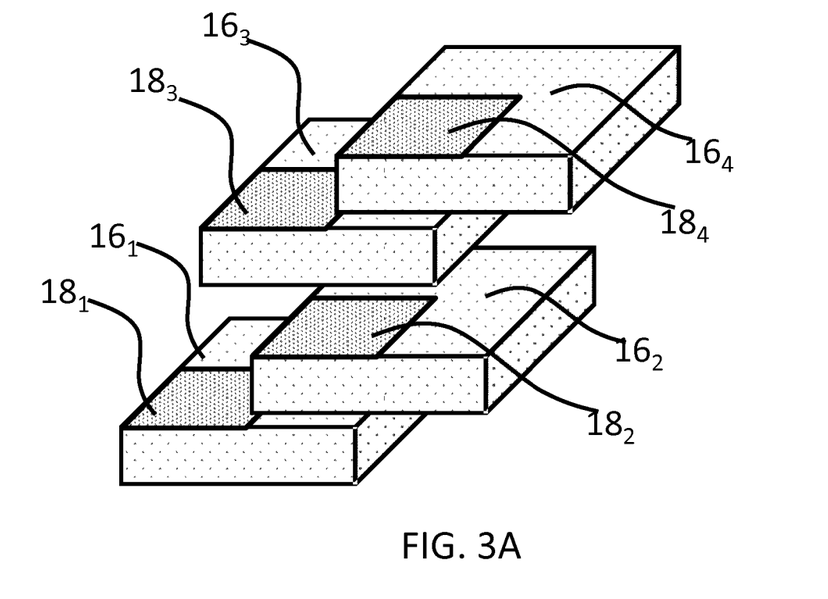
FIG. 3A depicts an arrangement of four LED light sources in accordance with an embodiment.
Figure 3B:
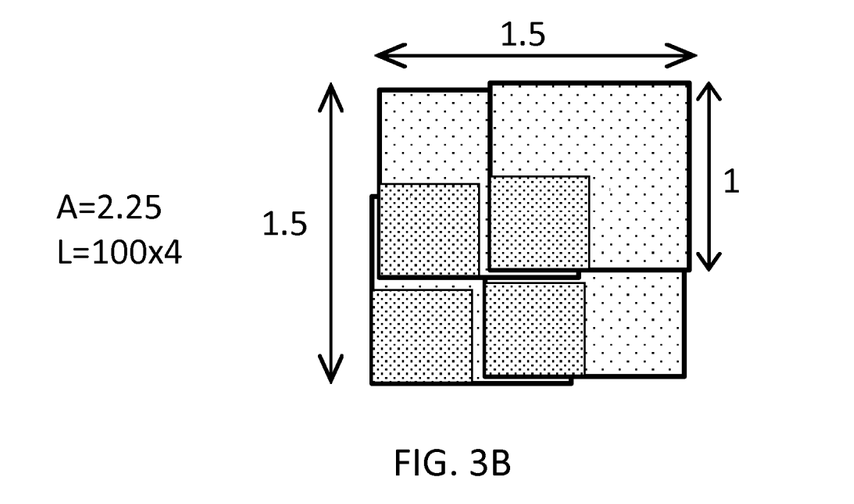
FIG. 3B is a plan view of the arrangement depicted in FIG. 3A.

Turning now to FIG. 3, there is depicted an arrangement of four LED light sources according to an embodiment. More specifically, FIG. 3A is an isometric view of the arrangement, and FIG. 3B is a plan view of the arrangement.

Each of the first to fourth LED light sources comprises an LED (not visible) and a light output section 18 above the semiconductor diode structure adapted to output light from the LED in a (vertical) light output direction. Here, each light output sections 18 is formed from a hole or aperture in a light reflecting structure 16 which encloses the LED. Each hole is filled with an optical enhancement material, such as a lumiramic material or phosphorescent material. The light reflecting structure 16 is adapted to reflect light from the LED towards the light output section 18. Also, for each LED light source, the light output section 18 is of smaller area than the LED it is situated above.

The first to fourth LED light sources are vertically stacked so that they are partially overlapping with none the light output sections 18 being overlapped.

More specifically, the first LED light source is arranged as the bottom (or lowermost) light source. The second LED light source is then positioned above the first light source such that it overlaps part of the light reflecting structure $16_1$ of the first LED light source but does not overlap the light output section $18_1$ of the first LED light source. Next, the third LED light source is then positioned above the second LED light source such that it overlaps part of the light reflecting structure $16_1$ and $16_2$ of the first and second LED light sources but does not overlap the light output sections $18_1$ and $18_2$ of the first and second LED light sources. Finally, the fourth LED light source is then positioned above the third LED light source such that it overlaps part of the light reflecting structure $16_1, 16_2, 16_3$ of the first, second and third LED light sources but does not overlap the light output sections $18_1, 18_2$ and $18_3$ of the first, second and thirds LED light sources.

Thus, when viewed from above, the light output sections of the four LED light sources are laterally adjacent and non-overlapping such that they are not aligned along the (vertical) light output direction. In other words, light that is output vertically from the light output section is not blocked by another LED light source positioned above.

Here, there is substantially zero separation between adjacent edges of light output sections. FIG. 3B only depicts a small separation between adjacent edges for ease of identification of the light output section, and so FIG. 3B should only be taken as guidance. It is appreciated that, in practice, it may be difficult to perfectly align adjacent edges to have zero lateral separation or overlap. Thus, in some embodiments, the light output sections may slightly overlap or may be laterally separated by a negligible or small amount.

The width and length of each LED light source is the same as those in FIG. 2, namely one (1) unit. The width and length of the arrangement of FIG. 3 is therefore 1.5 units. Thus, it will be easily understood that the total area of the depicted arrangement is 2.25 units (1.5×1.5).

Also, the light output sections are all of equal size and the same size as those in FIG. 2. Accordingly, like those of FIG. 2, each LED light source emits 100 lumen from its light output section. It will therefore be easily understood that the total light emitted from the arrangement is 400 lumen (4×100 lumen).

Comparing the arrangements of FIGS. 2 and 3, it is seen that the arrangement of FIG. 3 has a smaller total area than FIG. 2 but emits the same amount of lumen. Accordingly, the embodiment of FIG. 3 achieves a space/area saving compared to the arrangement of FIG. 2, whilst emitting the same amount of light.

Figure 4:
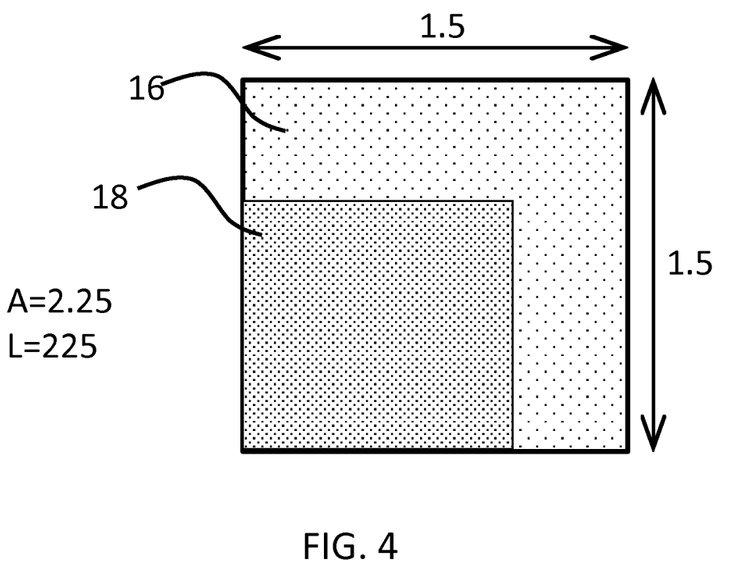
FIG. 4 is a plan view of a single LED light source having the same footprint area as the arrangement of FIGS. 3A and 3B.

Turning now to FIG. 4, there is shown a plan view of a single LED light source having the same footprint area as the arrangement of FIGS. 3A and 3B, namely 2.25 units. The light output section 18 also has the same area as the combined total area that of light output sections $18_1$-$18_4$ in FIGS. 3A and 3B, namely 1 unit. Nonetheless, despite having the same total/overall dimension as the embodiment of FIG. 3, simulations have shown that the single LED light source of FIG. 4 only outputs 225 lumen. Accordingly, the embodiment of FIG. 3 is 2.25 times brighter than the single LED source of equivalent area.

Figure 5:
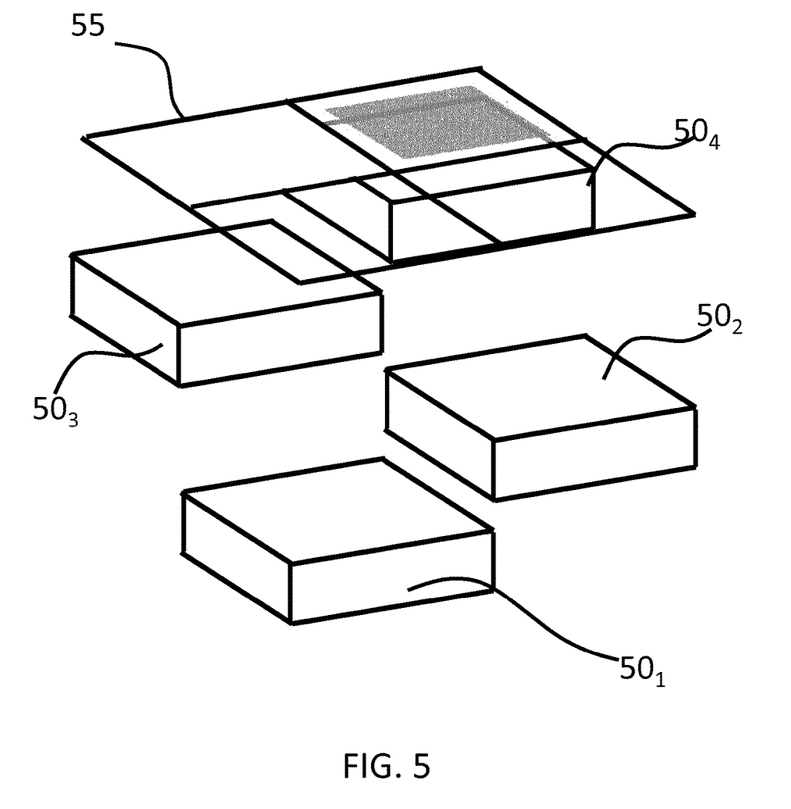
FIG. 5 is a 3-Dimensional model of an embodiment illustrating the relative contribution to the light output of each LED light source.

Turning now to FIG. 5, there is illustrated a 3-Dimensional model of an embodiment illustrating the relative contribution of each LED light source 50 to the total light output. From FIG. 5 it will be appreciated that the vertical arrangement of the LED light sources 50 results in the lowermost LED light source $50_1$ being distanced from a light exit plane 55 (situated on top of or above the uppermost light source $50_4$). Thus, as illustrated by the shading on the light exit plane 55 in FIG. 5, the lowermost LED light source $50_1$ may contribute significantly less to the total light output than the other, higher up LED light sources $50_2, 50_3, 50_4$.

Figure 6:
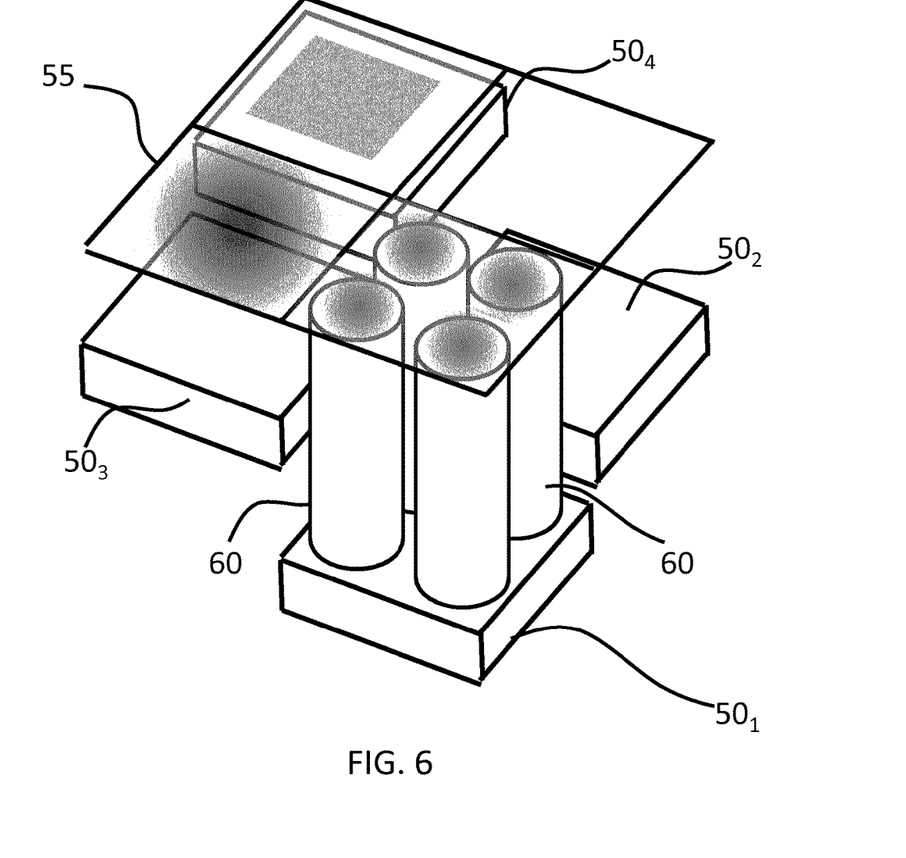
FIG. 6 shows a modification to the embodiment of FIG. 5 and illustrates the relative contribution to the light output of each LED light source.

To address this, a modification to an embodiment may be made as depicted in FIG. 6.

FIG. 6 shows a modification to the embodiment of FIG. 5, wherein the lowermost LED light source $50_1$ further comprises a plurality of upwardly projecting optical fibres 60 extending from the top surface of the lowermost LED light source $50_1$ to the light exit plane 55. By employing the optical fibres 60, light from the lowermost LED light source $50_1$ can be transmitted along the optical fibres 60 and output from the optical fibres close to (or at) the light exit plane 55. Thus, as illustrated by the shading on the light exit plane 55 in FIG. 6, the contribution of lowermost LED light source $50_1$ to the total light output may be increased compared to the arrangement of FIG. 5.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A light source comprising a first LED light source and a second LED light source, each of the first LED light source and the second LED light source comprising:
   a semiconductor diode structure adapted to generate light;
   a light output section above the semiconductor diode structure adapted to output light from the semiconductor diode structure in a light output direction, wherein:
      the light output section is positioned at a corner of a corresponding LED light source such that a corner and two edges of the light output section correspond to the corner and two edges of the LED light source,
      the second LED light source is arranged above and at least partially overlapping the first LED light source with non-aligned light output sections with respect to the light output direction,
      the area of the light output section is less than the area of the semiconductor diode structure,
      at least one of the first LED light source and the second LED light source further comprises a light reflecting structure at least partially enclosing side surfaces of the semiconductor diode structure and adapted to reflect light from the semiconductor diode structure towards the light output section,
      the light reflecting structure comprises an aperture formed in the light reflecting structure, and
      the light output sections of the first LED light source and the second LED light source are non-overlapping.

2. The light source of claim 1, wherein there is a lateral separation between adjacent edges of the light output sections of the first LED light source and the second LED light source, wherein the lateral separation is less than 10% of a lateral width of a respective light output section.

3. The light source of claim 1, wherein the aperture comprises an optical enhancement material.

4. The light source of claim 1, wherein the light output section of at least one of the first LED light source or the second LED light source comprises an optical enhancement material.

5. The light source of claim 1, wherein the first LED light source further comprises a plurality of upwardly projecting optical fibres positioned on top of the light output section of the first LED light source.

6. The light source of claim 1, further comprising an automotive light.

7. The light source of claim 1, further comprising a projector light.

8. The light source of claim 1, wherein the second LED light source further comprises a plurality of upwardly projecting optical fibres positioned on top of the light output section of the second light source.

9. The light source of claim 1, further comprising a camera flashlight.

10. The light source of claim 1, further comprising a spot light.

11. A light source comprising a first LED light source and a second LED light source, each of the first LED light source and the second LED light source comprising:
    a semiconductor diode structure adapted to generate light;
    a light output section above the semiconductor diode structure adapted to output light from the semiconductor diode structure in a light output direction, wherein:
       the second LED light source is arranged above and at least partially overlapping the first LED light source with non-aligned light output sections with respect to the light output direction,
       the area of the light output section is less than the area of the semiconductor diode structure,
       at least one of the first LED light source and the second LED light source further comprises a light reflecting structure at least partially enclosing side surfaces of the semiconductor diode structure and adapted to reflect light from the semiconductor diode structure towards the light output section,
       the light reflecting structure comprises an aperture formed in the light reflecting structure, and
       there is a lateral overlap of portions of respective light output sections of the first LED light source and the second LED light source, the lateral overlap being less than 10% of a lateral width of a respective light output section.

12. The light source of claim 11, wherein the aperture comprises an optical enhancement material.

13. The light source of claim 11, wherein the light output section of at least one of the first LED light source or the second LED light source comprises an optical enhancement material.

14. The light source of claim 11, wherein the first LED light source further comprises a plurality of upwardly projecting optical fibres positioned on top of the light output section of the first LED light source.

15. The light source of claim 11, further comprising an automotive light.

16. The light source of claim 11, further comprising a projector light.

17. The light source of claim 11, wherein the second LED light source further comprises a plurality of upwardly projecting optical fibres positioned on top of the light output section of the second light source.

18. The light source of claim 11, further comprising a camera flashlight.

19. The light source of claim 11, further comprising a spot light.

20. The light source of claim 11, wherein the light output section is positioned at a corner of a corresponding LED light source such that a corner and two edges of the light output section correspond to the corner and two edges of the LED light source.

21. A method to manufacture a light source, the method comprising:
    providing a first LED light source and a second LED light source, each of the first LED light source and the second LED light source having,
       a semiconductor diode structure adapted to generate light,
       a light output section above the semiconductor diode structure adapted to output light from the semiconductor diode structure in a light output direction, and
       the light output section is positioned at a corner of a corresponding LED light source such that a corner and two edges of the light output section correspond to the corner and two edges of the LED light source; and
    arranging the second LED light source above and at least partially overlapping the first LED light source with non-aligned light output sections with respect to the light output direction, wherein:
       the area of the light output section is less than the area of the semiconductor diode structure,
       at least one of the first LED light source and the second LED light source further comprises a light reflecting structure at least partially enclosing side surfaces of the semiconductor diode structure and adapted to reflect light from the semiconductor diode structure towards the light output section, the-light reflecting structure comprises an aperture formed in the light reflecting structure, and the light output sections of the first LED light source and the second LED light source are non-overlapping.

22. A method to manufacture a light source, the method comprising:

providing a first LED light source and a second LED light source, each of the first LED light source and the second LED light source having, a semiconductor diode structure adapted to generate light, and having a light output section above the semiconductor diode structure adapted to output light from the semiconductor diode structure in a light output direction; and arranging the second LED light source above and at least partially overlapping the first LED light source with non-aligned light output sections with respect to the light output direction, wherein:

the area of the light output section is less than the area of the semiconductor diode structure, at least one of the first LED light source and the second LED light source further comprises a light reflecting structure at least partially enclosing side surfaces of the semiconductor diode structure and adapted to reflect light from the semiconductor diode structure towards the light output section, the-light reflecting structure comprises an aperture formed in the light reflecting structure, and there is a lateral overlap of portions of respective light output sections of the first LED light source and the second LED light source, the lateral overlap being less than 10% of a lateral width of a respective light output section.

23. The method of claim 22, wherein the light output section is positioned at a corner of a corresponding LED light source such that a corner and two edges of the light output section correspond to the corner and two edges of the LED light source.

* * * * *